(12) United States Patent
Sawada et al.

(10) Patent No.: US 6,731,188 B2
(45) Date of Patent: May 4, 2004

(54) SURFACE ACOUSTIC WAVE FILTER DEVICE WITH AN UNBALANCED-TO-BALANCED CONVERSION FUNCTION

(75) Inventors: Yoichi Sawada, Ishikawa-ken (JP); Yuichi Takamine, Kanazawa (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 10/087,800

(22) Filed: Mar. 5, 2002

(65) Prior Publication Data

US 2002/0163403 A1 Nov. 7, 2002

(30) Foreign Application Priority Data

Mar. 23, 2001 (JP) .......................................... 2001-085138

(51) Int. Cl.$^7$ .............................. H03H 9/64; H03H 9/72
(52) U.S. Cl. ........................ 333/193; 333/195; 333/133
(58) Field of Search ................................. 333/193–196, 333/133; 310/313 R, 313 B, 313 C, 313 D

(56) References Cited

U.S. PATENT DOCUMENTS 5,874,868 A * 2/1999 Shimoe ....................... 333/193
5,986,524 A * 11/1999 Shimoe ....................... 333/195
5,994,980 A * 11/1999 Tada ............................ 333/193
6,111,481 A * 8/2000 Ueda et al. .................. 333/194
6,255,915 B1 * 7/2001 Edmonson ................... 333/193
6,424,239 B1 * 7/2002 Ehara et al. ................. 333/193
6,483,402 B2 * 11/2002 Endoh et al. ................ 333/193
6,556,100 B2 * 4/2003 Takamine .................... 333/133

FOREIGN PATENT DOCUMENTS

JP       10-117123      5/1998
JP       2002-359541    12/2002

\* cited by examiner

*Primary Examiner*—Barbara Summons
(74) *Attorney, Agent, or Firm*—Keating & Bennett, LLP

(57) ABSTRACT

A surface acoustic wave filter device, having a balanced-to-unbalanced conversion function, in which input/output impedances are different and in which the in-band degree of balance is satisfactory, is obtained. The surface acoustic wave filter device has a balanced-to-unbalanced conversion function, in which the spacing of input/output IDTs of a second surface acoustic wave filter element is larger by approximately half the wavelength of the surface-acoustic wave than that of a first surface acoustic wave filter element so that the phase is inverted, wherein the total of the electrostatic capacitance values of a plurality of IDTs of the second surface acoustic wave filter element is larger than the total of the electrostatic capacitance values of a plurality of IDTs of the first surface acoustic wave filter element.

19 Claims, 12 Drawing Sheets

SURFACE ACOUSTIC WAVE FILTER DEVICE WITH AN UNBALANCED-TO-BALANCED CONVERSION FUNCTION

BACKGROUND OF THE INVENTION

1. Field of the Invention

The present invention relates to a surface acoustic wave filter device, for use as, for example, a band-pass filter provided in, for example, portable telephones. More particularly, the present invention relates to a surface acoustic wave filter device in which the characteristic impedance on the input side differs from the characteristic impedance on the output side and which has an unbalanced-to-balanced conversion function.

2. Description of the Related Art

In recent years, to decrease the size of portable telephones, composite components in which the number of component parts and the sizes thereof are reduced and which have multiple functions have been developed.

In such a surface acoustic wave filter used in the RF stage of a portable telephone, one having an unbalanced-to-balanced conversion function has been used.

In a portable telephone, the portion from the antenna to the surface acoustic wave filter as a band-pass filter is defined by an unbalanced circuit, and generally has a characteristic impedance of 50 Ω. In contrast, an amplifier used in a later stage of the surface acoustic wave filter has a balanced terminal and often has an impedance of 150 Ω to 200 Ω. Therefore, a surface acoustic wave filter device having a balanced-to-unbalanced conversion function that converts an unbalanced input of 50 Ω into a balanced output of 150 Ω to 200 Ω has been used.

An example of this type of surface acoustic wave filter is disclosed in Japanese Unexamined Patent Application Publication No. 10-117123. Referring to FIG. 19, this conventional surface acoustic wave filter device is described below. In a surface acoustic wave filter device 500, surface acoustic wave filters 511 and 512 are connected to an unbalanced input terminal 500a. The surface acoustic wave filter 511 is configured such that the surface acoustic wave filters 511a and 511b are cascaded in two steps. Similarly, the surface acoustic wave filter 512 is configured such that the surface acoustic wave filters 512a and 512b are cascaded in two steps. The output ends of the surface acoustic wave filters 511 and 512 are provided as balanced output terminals 500b and 500c, respectively.

In the filter having a balanced-to-unbalanced conversion function, there is a demand for the transmission characteristics in the pass band between an unbalanced terminal and one of the balanced terminals to have an equal amplitude and a phase which is inverted by 180° with respect to the transmission characteristics in the pass band between the unbalanced terminal and the other balanced terminal. Such relationships of amplitude and phase between two transmission characteristics are called "degree of amplitude balance" and "degree of phase balance", respectively.

The above-described degree of amplitude balance and degree of phase balance are expressed by the following equations when a filter device having balanced-to-unbalanced input/outputs is a device of three ports and when the unbalanced input terminal is denoted as "port 1" and the balanced output terminals are denoted as "port 2" and "port 3":

$$\text{Degree of amplitude balance} = |A|$$

where $A = |20 \times \log S21| - |20 \times \log S31|$, and where S21 represents the amplitude of the transmission characteristics between port 1 and port 2, and S31 represents the amplitude of the transmission characteristics between port 1 and port 3.

$$\text{Degree of phase balance} = |B - 180|$$

where $B = |\angle S21 - \angle S31|$, and where $\angle S21$ represents the phase between port 1 and port 2, and $\angle S31$ represents the phase between port 1 and port 3.

Ideally, in the pass band of the filter, the degree of amplitude balance is 0 dB and the degree of phase balance is zero degrees. However, in practice, the degree of amplitude balance only needs to be 1.5 dB or less, and the degree of phase balance only needs to be 20 degrees or less. Preferably, the degree of amplitude balance is 1.0 dB or less, and the degree of phase balance is 10 degrees or less.

In the conventional surface acoustic wave filter having a balanced-to-unbalanced conversion function, such as the above-described Japanese Unexamined Patent Application Publication No. 10-117123, to invert the phase of the transmission characteristics between an unbalanced terminal and one of the balanced terminals with respect to the transmission characteristics between the unbalanced terminal and the other balanced terminal, a method in which the polarity of an IDT (Interdigital Transducer) is inverted or a method in which, when the wavelength of the surface wave is denoted as λ, the IDT-to-IDT spacing is widened by 0.5λ, is used. As a consequence, a difference occurs in the electrical characteristics due to the difference between the configuration between an unbalanced terminal and one of the balanced terminals and the configuration between the unbalanced terminal and the other balanced terminal. Therefore, the degree of amplitude balance and the degree of phase balance in the pass band are often unsatisfactory.

Furthermore, in the surface acoustic wave filter device disclosed in Japanese Unexamined Patent Application Publication No. 10-117123, to prevent the deterioration of the above-described degree of balance, four surface acoustic wave filter devices 511a, 511b, 512a, and 512b are used, and each of the surface acoustic wave filter devices 511 and 512 has a two-step configuration. As a result, the size of the surface acoustic wave filter device 500 is substantially increased, and thus, size reduction is difficult. Furthermore, since the number of surface acoustic wave filter devices which can be manufactured from one wafer is decreased, the manufacturing costs substantially increase.

SUMMARY OF THE INVENTION

In order to overcome the above-described problems, preferred embodiments of the present invention provide a surface acoustic wave filter device which has a balanced-to-unbalanced conversion function, in which input and output impedances are different, which has a satisfactory degree of amplitude balance and degree of phase balance, and having a greatly reduced size and cost.

According to a first preferred embodiment of the present invention, a surface acoustic wave filter device includes a first surface acoustic wave filter element having a plurality of IDTs provided along the propagation direction of a surface-acoustic wave on a piezoelectric substrate and having first and second terminals, and a second surface acoustic wave filter element having a plurality of IDTs arranged along the propagation direction of a surface-acoustic wave on a piezoelectric substrate, the spacing between input/output IDTs is greater than that of the first surface acoustic wave filter element by approximately half the wavelength of the surface-acoustic wave, and having first and second terminals, the first terminals of the first and second surface acoustic wave filter elements being commonly connected to an unbalanced terminal, and the second terminals of the first and second surface acoustic wave filter elements being connected to a balanced terminal, wherein the total of the electrostatic capacitance values of the plurality of IDTs of the second surface acoustic wave filter element is greater than the total of the electrostatic capacitance values of the plurality of IDTs of the first surface acoustic wave filter element.

In the surface acoustic wave filter device in accordance with the first preferred embodiment of the present invention, when the total of the electrostatic capacitance values of the plurality of IDTs of the second surface acoustic wave filter element is denoted as C2 and when the total of the electrostatic capacitance values of the plurality of IDTs of the first surface acoustic wave filter element is denoted as C1, the condition $C1<C2<1.20(C1)$ is preferably satisfied.

When the amount of electrode coverage in the plurality of IDTs of the first surface acoustic wave filter element is denoted as M1, the electrode finger crossing width is denoted as W1, the total number of pairs of the electrode fingers of the plurality of IDTs is denoted as N1, the amount of electrode coverage in the plurality of IDTs of the second surface acoustic wave filter element is denoted as M2, the electrode finger crossing width is denoted as W2, the total number of pairs of the electrode fingers of the plurality of IDTs is denoted as N2, the condition $M1 \times W1 \times N1 < M2 \times W2 \times N2 < 1.20 \times M1 \times W1 \times N1$ is satisfied, and more preferably, the condition $0.93 \times M1 < M2 < 1.05 \times M1$ is preferably satisfied.

The first and second surface acoustic wave filter elements have reflectors on both sides of the area where the IDTs are located, when the spacing between the reflector of the first surface acoustic wave filter element and the IDT adjacent to the reflector is denoted as GR1, and when the spacing between the reflector of the second surface acoustic wave filter element and the IDT adjacent to the reflector is denoted as GR2, the condition $0.96 GR1 < GR2 < 1.02 GR1$ is preferably satisfied.

According to a second preferred embodiment of the present invention, a surface acoustic wave filter device includes a first surface acoustic wave filter element having a plurality of IDTs arranged along the propagation direction of a surface-acoustic wave on a piezoelectric substrate and having first and second terminals, and a second surface acoustic wave filter element having a plurality of IDTs arranged along the propagation direction of a surface-acoustic wave on a piezoelectric substrate, the spacing between input/output IDTs is greater than that of the first surface acoustic wave filter element by approximately half the wavelength of the surface-acoustic wave, and having first and second terminals, the first terminals of the first and second surface acoustic wave filter elements being commonly connected to an unbalanced terminal, and the second terminals of the first and second surface acoustic wave filter elements being connected to a balanced terminal, wherein, in at least one of the first and second surface acoustic wave filter elements, at least one IDT-to-IDT spacing is different from the other IDT-to-IDT spacings by an integer multiple of the wavelength of the surface-acoustic wave.

In the first surface acoustic wave filter element, at least one IDT-to-IDT spacing is different from the other IDT-to-IDT spacings by an integer multiple of the wavelength of the surface-acoustic wave, and in the second surface acoustic wave filter element, a plurality of the IDT-to-IDT spacings are greater than the smallest IDT-to-IDT spacing of the first surface acoustic wave filter element and are less than the largest IDT-to-IDT spacing of the first surface acoustic wave filter element.

In the first surface acoustic wave filter element, at least one IDT-to-IDT spacing is different from the other IDT-to-IDT spacings by approximately one wavelength of the surface-acoustic wave, and in the second surface acoustic wave filter element, the plurality of IDT-to-IDT spacings have substantially the same value and are greater by approximately half the wavelength of the surface-acoustic wave than the smallest IDT-to-IDT spacing of the first surface acoustic wave filter element.

In the surface acoustic wave filter device in accordance with the first and second preferred embodiments of the present invention, the surface acoustic wave filter device further includes surface acoustic wave resonators which are connected in parallel or in series on at least one of the balanced terminal side and the unbalanced terminal side.

In the surface acoustic wave filter device in accordance with preferred embodiments of the present invention, the surface acoustic wave filter device also preferably includes surface acoustic wave resonator-type filters which are cascaded on at least one of the balanced terminal side and the unbalanced terminal side.

A communication device in accordance with another preferred embodiment of the present invention includes a surface acoustic wave filter device according any of the preferred embodiments of the present invention described above.

In the surface acoustic wave filter device according to the first preferred embodiment of the present invention, in a configuration in which the second surface acoustic wave filter element is arranged such that the spacing between input/output IDTs is greater than that of the first surface acoustic wave filter element by approximately half the wavelength of the surface-acoustic wave, and the phase characteristics are inverted, the difference in the impedance characteristics, which occurs as a result differing the IDT-to-IDT spacing, is corrected by making the total of the electrostatic-capacitance values of the second surface acoustic wave filter elements greater than the total of the electrostatic-capacitance values of the first surface acoustic wave filter elements.

Therefore, a surface acoustic wave filter device having a balanced-to-unbalanced conversion function, in which the in-band degree of amplitude balance is satisfactory, is provided. As a result, a surface acoustic wave filter device is provided which has a balanced-to-unbalanced conversion function, in which the degree of balance is satisfactory and in which input and output impedances are different.

In particular, when the total of the electrostatic capacitance values of the plurality of IDTs of the second surface acoustic wave filter element is denoted as C2 and when the total of the electrostatic capacitance values of the plurality of IDTs of the first surface acoustic wave filter element is denoted as C1, the degree of amplitude balance is effectively improved when the condition $C1<C2<1.20(C1)$ is satisfied. In a similar manner, when the amount of electrode coverage in the plurality of IDTs of the first surface acoustic wave filter element is denoted as M1, the electrode finger crossing width is denoted as W1, the total number of pairs of electrode fingers is denoted as N1, the amount of electrode coverage in the plurality of IDTs of the second surface acoustic wave filter element is denoted as M2, the electrode finger crossing width is denoted as W2, the total number of pairs of electrode fingers of the plurality of IDTs is denoted as N2, the degree-of-balance is effectively improved similarly when the condition M1×W1×N1<M2×W2×N2<1.20× M1×W1×N1 is satisfied, and the degree-of-balance is further improved when the condition 0.93×M1<M2<1.05×M1 is satisfied.

Furthermore, the degree of phase balance is also effectively improved when the spacings GR1 and GR2 between the reflectors in the first and second surface acoustic wave filter elements and the IDT adjacent to the reflector are set such that 0.96GR1<GR2<1.02GR1.

In the surface acoustic wave filter device in accordance with the second preferred embodiment of the present invention, since the IDT-to-IDT spacing of the first surface acoustic wave filter element differs by one wavelength between the right and left, and the IDT-to-IDT spacing of the second surface acoustic wave filter element is greater by approximately half the wavelengths than the smallest one of the IDT-to-IDT spacing of the first surface acoustic wave filter elements between the right and left, the difference in the impedance characteristics due to the IDT-to-IDT spacing is averaged. Therefore, the impedance characteristics of the first and second surface acoustic wave filter elements substantially match each other, and the degree of amplitude balance is effectively maintained. As a result, according to the second preferred embodiment of the present invention, a surface acoustic wave filter device has a balanced-to-unbalanced conversion function, in which the degree of balance is satisfactory and in which input and output impedances are different.

In the present invention, when surface acoustic wave resonators are connected in parallel or in series on at least one of the balanced terminal side and the unbalanced terminal side, the amount of out-of-band attenuation is greatly increased without deteriorating the in-band insertion loss. Similarly, in a case where surface acoustic wave resonator-type filters are connected on at least one of the balanced terminal side and the unbalanced terminal side, the amount of out-of-band attenuation is greatly increased.

Other features, elements, characteristics and advantages of the present invention will become more apparent from the following detailed description of preferred embodiments thereof with reference to the attached drawings.

DETAILED DESCRIPTION OF PREFERRED EMBODIMENTS

Figure 1:
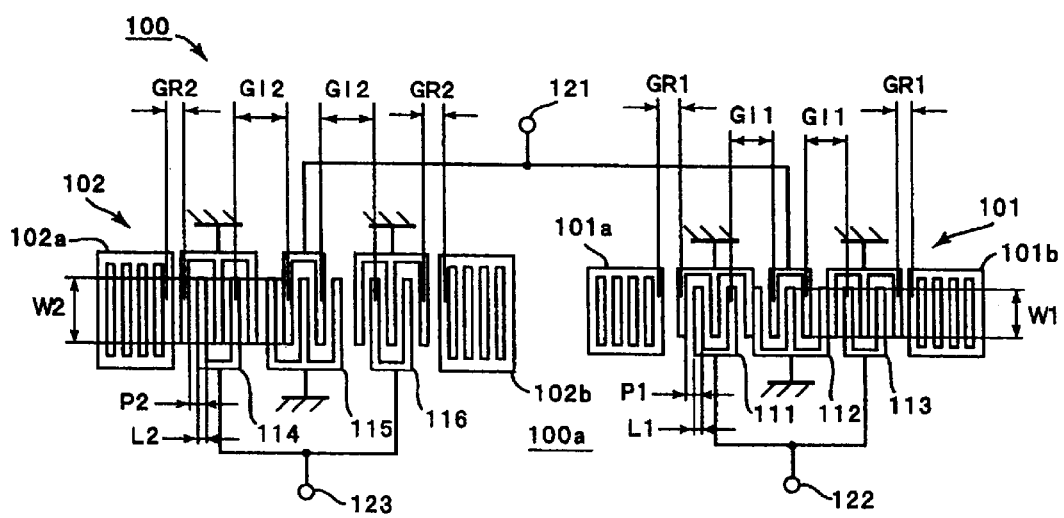
FIG. 1 is a schematic plan view of a surface acoustic wave filter device according to a first preferred embodiment of the present invention.

Referring to the drawings, the present invention will be described with reference to specific preferred embodiments of a surface acoustic wave filter device according to the present invention.

FIG. 1 is a schematic plan view of a surface acoustic wave filter device according to a first preferred embodiment of the present invention.

In a surface acoustic wave filter device 100, by providing an electrode configuration shown in FIG. 1 on a piezoelectric substrate 100a, a first surface acoustic wave filter element 101 and a second surface acoustic wave filter element 102 are provided. In this preferred embodiment, the first surface acoustic wave filter element 101 has first to third IDTs 111 to 113 arranged along the propagation direction of the surface-acoustic wave, and the second surface acoustic wave filter element 102 has first to third IDTs 114 to 116 arranged along the propagation direction of the surface-acoustic wave. Furthermore, in the first surface acoustic wave filter element 101, reflectors 101a and 101b are arranged on both sides of the three IDTs in the propagation direction of the surface-acoustic wave, and in the second surface acoustic wave filter element 102, reflectors 102a and 102b are arranged on both sides of the three IDTs in the propagation direction of the surface-acoustic wave.

Each first terminal which is one end of each of the IDTs 112 in the approximate center of the first surface acoustic wave filter element 101, and each first terminal which is one end of each of the IDTs 115 in the approximate center of the second surface acoustic wave filter element 102 are commonly connected, and these are electrically connected to an unbalanced input terminal 121.

One end of each of the IDTs 111 and 113 of the first surface acoustic wave filter element 101 are commonly connected, forming a second terminal, and the second terminal is connected to a first balanced output terminal 122. Furthermore, the output ends of the IDTs 114 and 116 of the second surface acoustic wave filter element 102 are commonly connected, forming a second terminal, and the second terminal is electrically connected to a second balanced output terminal 123.

The features of this preferred embodiment are such that the total of the electrostatic capacitance values of the IDTs 114 to 116 of the second surface acoustic wave filter element 102 is greater than the total of the electrostatic capacitance values of the IDTs 111 to 113 of the first surface acoustic wave filter element 101. As a consequence, in the surface acoustic wave filter device 100 having a balanced-to-unbalanced conversion function, the degree of amplitude balance and the degree of phase balance are greatly improved. This will be described with reference to specific experimental examples.

As a piezoelectric substrate, a $LiTaO_3$ substrate was used. The piezoelectric substrate may, alternatively, be formed by another piezoelectric single-crystal or piezoelectric ceramic.

The first and second surface acoustic wave filter elements 101 and 102 are provided on the piezoelectric substrate.

It should be noted that the number of electrode fingers in each of the first and second surface acoustic wave filter elements 101 and 102 and the number of electrode fingers of the reflectors shown in FIG. 1 are smaller than the actual number are in order to simplify the illustration.

A specific example of the present preferred embodiment is described below.

(1) The First Surface Acoustic Wave Filter Element 101

The electrode finger crossing width W1=128 μm.

The number of pairs of the electrode fingers in the IDTs: the number of pairs of electrode fingers of the IDT 112 in the approximate center=17, and the number of pairs of the electrode fingers of each of the IDTs 111 and 113 on both sides=11.

The electrode finger pitch P1 in the IDT 111 to 113=2.10 μm.

The amount of electrode coverage in the IDT L1/P1=0.72 (L1 is the electrode finger width).

The number of electrode fingers of the reflectors 101a and 101b=120.

The electrode finger pitch PR of the reflectors 101a and 101b=2.15 μm.

The IDT-to-IDT spacing GI1 in the IDT 111 to 113=1.27λ, where λ represents the wavelength of the surface-acoustic wave. In this specification, the "IDT-to-IDT spacing" is assumed to refer to the distance between the centers of the electrode fingers on the side of the signal electrode to which the adjacent IDT is closest.

The IDT-to-reflector spacing GR1=0.500λ, and the "IDT-to-reflector spacing" is defined by the distance between the centers of the adjacent electrode fingers of the IDT and the reflector.

(2) The Second Surface Acoustic Wave Filter Element 102

The crossing width W2=145 μm.

The number of pairs of the electrode fingers in the IDTs 114 to 116: the number of pairs of the electrode fingers of the IDT 115 in the approximate center=17, and the number of pairs of each of the electrode fingers of the IDTs 114 and 116 on both sides=17.

The electrode finger pitch P2 of the IDTs 114 to 116=2.10 μm.

The amount of electrode coverage in the IDT L2/P2=0.70 (L2 is the electrode finger width)

The number NR of the electrode fingers of the reflectors 102a and 102b=120.

The electrode finger pitch PR of the reflectors 102a and 102b=2.15 μm.

The IDT-IDT spacing GI2=1.77 λ.

The IDT-to-reflector spacing GR=0.494 λ.

In the surface acoustic wave filter device 100 of this preferred embodiment, the total of the electrostatic capacitance values of the IDTs 111 to 113 in the surface acoustic wave filter element 101 is preferably about 3.0 pF, and the total of the electrostatic capacitance values of the IDTs 114 to 116 of the surface acoustic wave filter element 102 is preferably about 3.4 pF.

In the surface acoustic wave filter device 100 of this preferred embodiment, in the first surface acoustic wave filter element 101 and the second surface acoustic wave filter element 102, the IDT-to-IDT spacing differs as described above. That is, since the IDT-to-IDT spacing in the surface acoustic wave filter element 102 is different by half the wavelength than that of the surface acoustic wave filter element 101, the transmission phase characteristics between the unbalanced input terminal 121 and the balanced output terminal 122 differ by approximately 180° from the transmission phase characteristics between the unbalanced input terminal 121 and the balanced output terminal 123.

Figure 2:
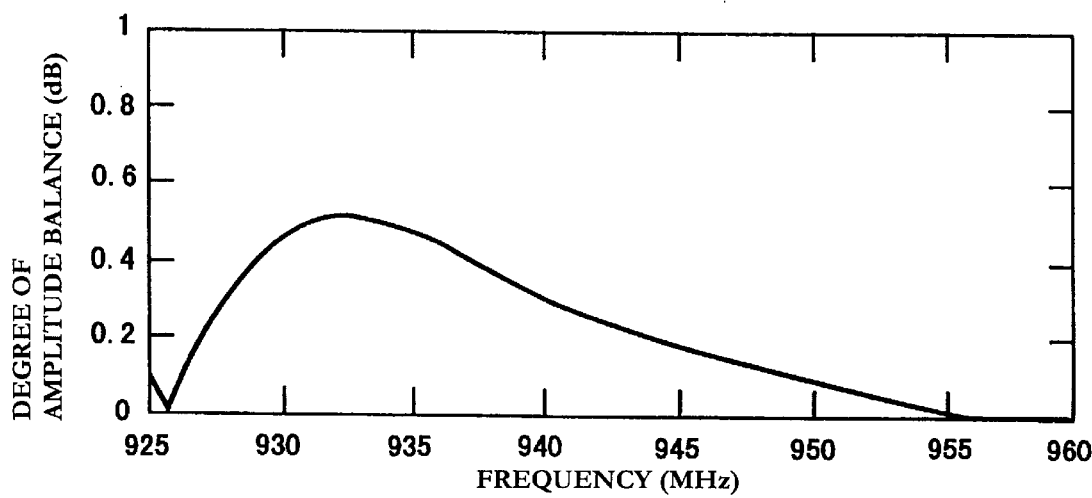
FIG. 2 shows the in-band degree of amplitude balance of the surface acoustic wave filter device of the first preferred embodiment of the present invention.
Figure 3:
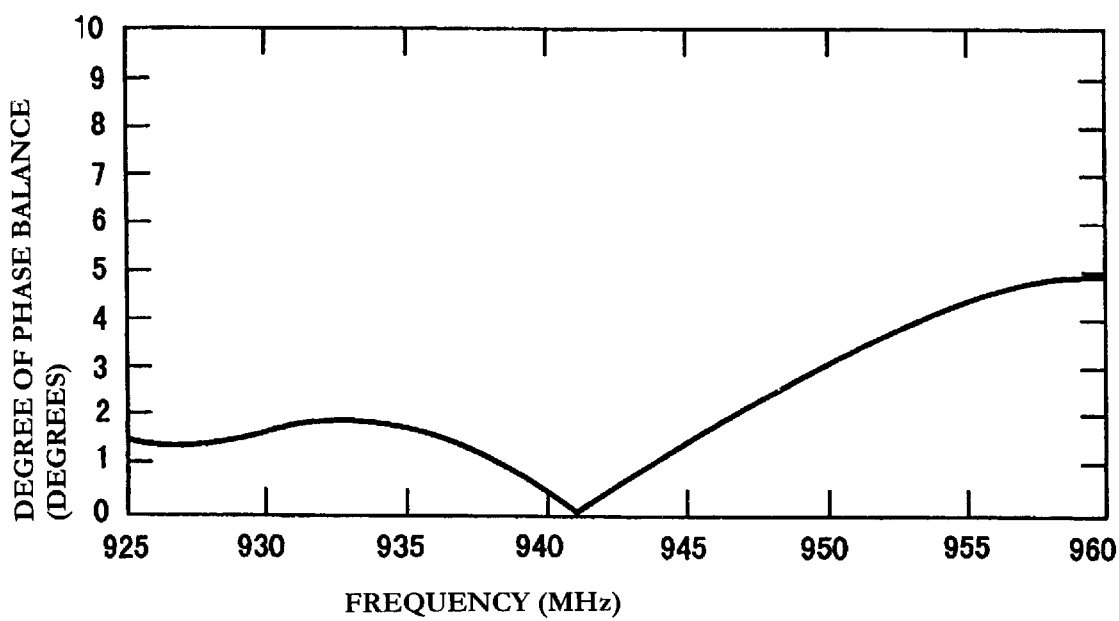
FIG. 3 shows the in-band degree of phase balance of the surface acoustic wave filter device of the first preferred embodiment of the present invention.

The frequency characteristics of the degree of amplitude balance and the degree of phase balance of the surface acoustic wave filter device 100 of this preferred embodiment are shown in FIGS. 2 and 3.

Figure 19:
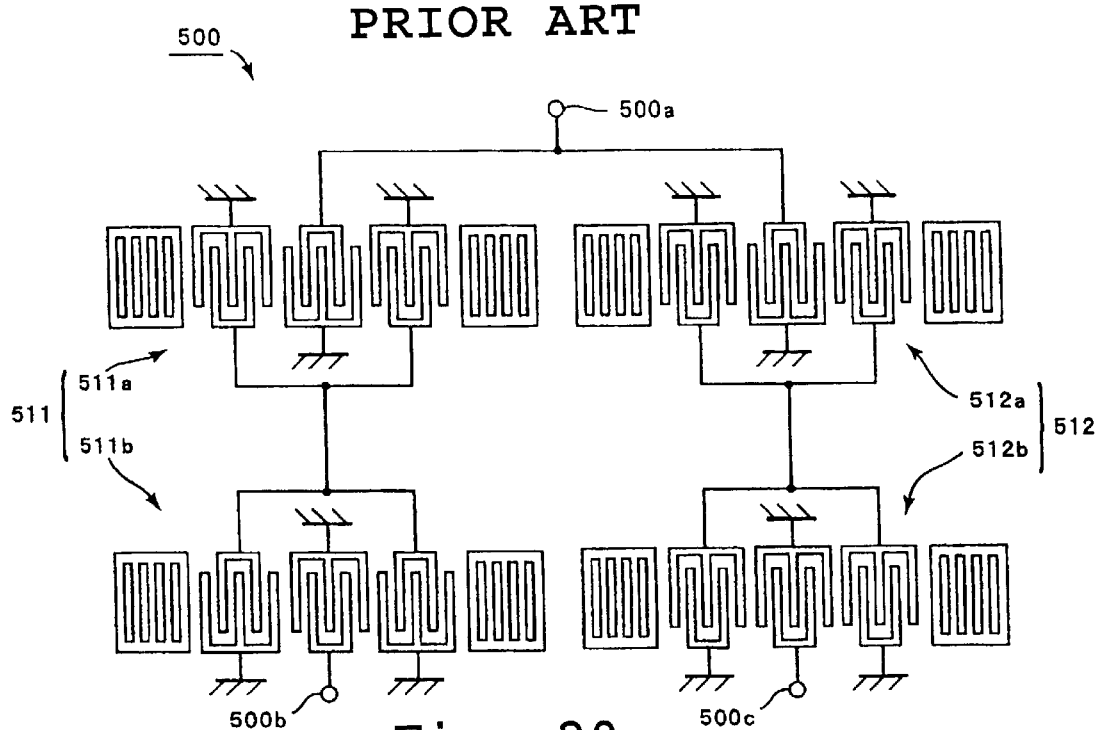
FIG. 19 is a schematic plan view showing an example of a conventional surface acoustic wave filter device.
Figure 20:
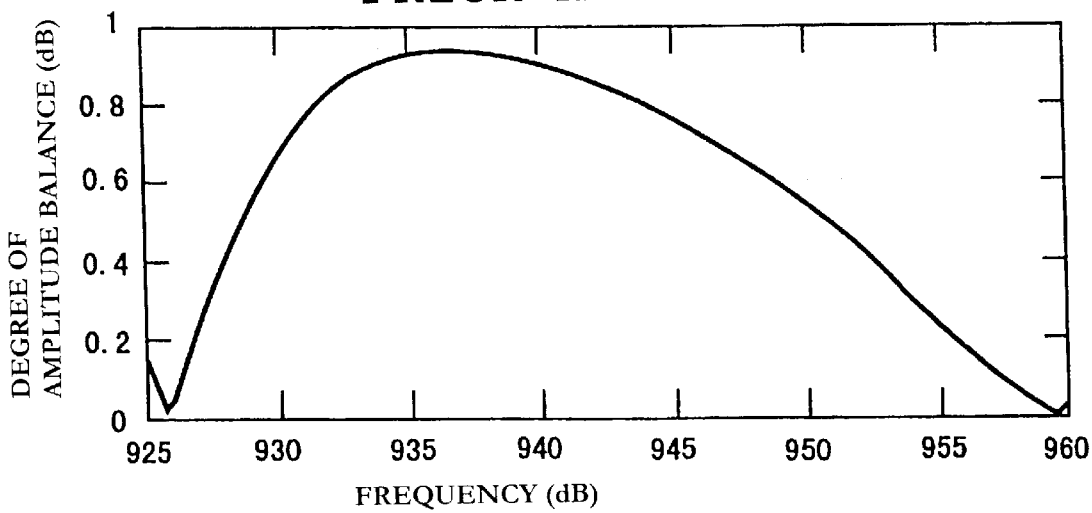
FIG. 20 shows the in-band degree of amplitude balance of the conventional surface acoustic wave filter device shown in FIG. 19.
Figure 21:
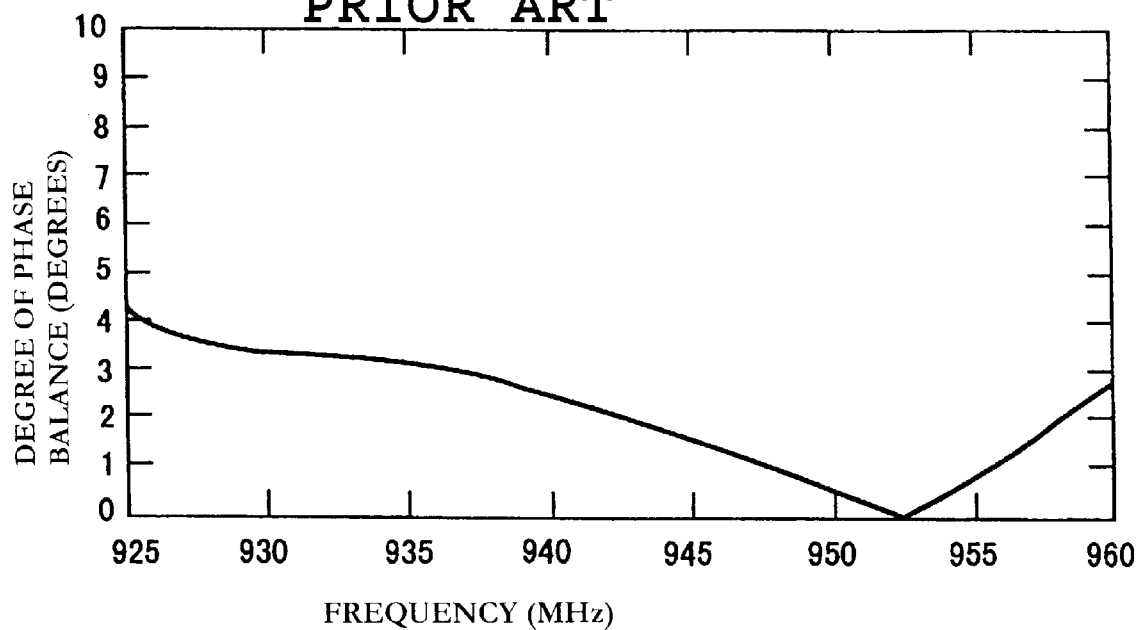
FIG. 21 shows the in-band degree of phase balance of the conventional surface acoustic wave filter device shown in FIG. 19.

For comparison, the frequency characteristics of the degree of amplitude balance and the degree of phase balance of the conventional surface acoustic wave filter device 500 shown in FIG. 19 are shown in FIGS. 20 and 21. A comparison between FIGS. 2 and 3 and FIGS. 20 and 21 shows that, in this preferred embodiment, the in-band degree of amplitude balance is about 0.5 dB or less and the in-band degree of phase balance is about 4.9 degrees or less, such that the degrees of balances are satisfactory.

The reason the degrees of balances are improved in this preferred embodiment in the manner described above will be described below in detail.

In the surface acoustic wave filter device 100, an electrical signal is input to the unbalanced input terminal 121, the electrical signal is filtered in each of the surface acoustic wave filter elements 101 and 102, and an output is extracted from the balanced output terminals 122 and 123. Here, between the surface acoustic wave filter element 101 and the second surface acoustic wave filter element 102, the IDT-to-IDT spacing differs by half the wavelength of the surface-acoustic wave in the manner described above. Consequently, the amplitude characteristics to be filtered are substantially the same, and the transmission phase characteristics are inverted. Therefore, the amplitude characteristics of the electrical signal induced in the balanced output terminals 122 and 123 are substantially the same, and the transmission phase characteristics are inverted.

Figure 4A:
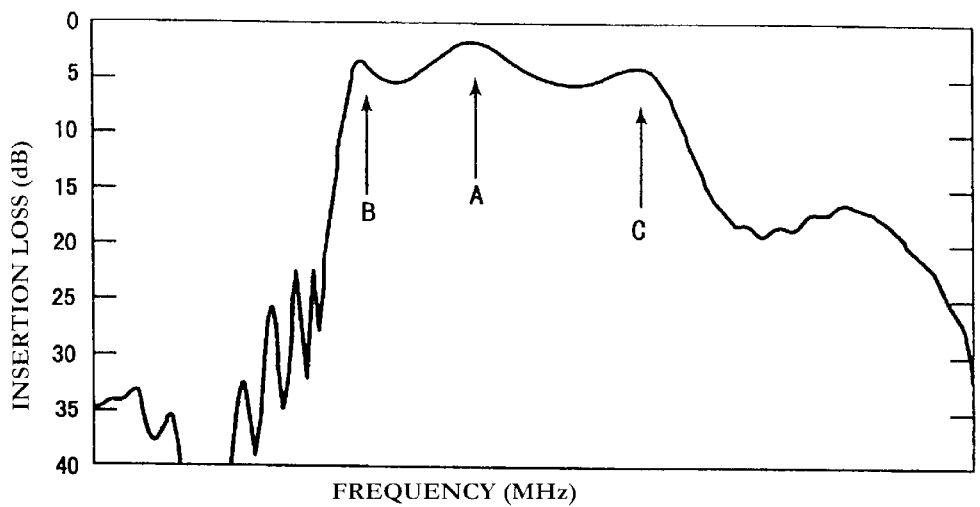
FIG. 4A illustrates the operating principles of a surface acoustic wave filter element used in the first preferred embodiment of the present invention, and shows the frequency relationships of the resonance modes.

In the cascading-resonator-type surface acoustic wave filter of a three-IDT type as in this preferred embodiment, typically three resonance modes shown in FIG. 4A are used to form a pass band. In FIG. 4A, to make the resonance modes easier to understand, frequency characteristics which were measured by intentionally placing the input/output impedances in an unmatching state are shown. The portions indicated by the arrows A, B, and C are the resonance frequencies of each of the resonance modes.

Figure 4B:
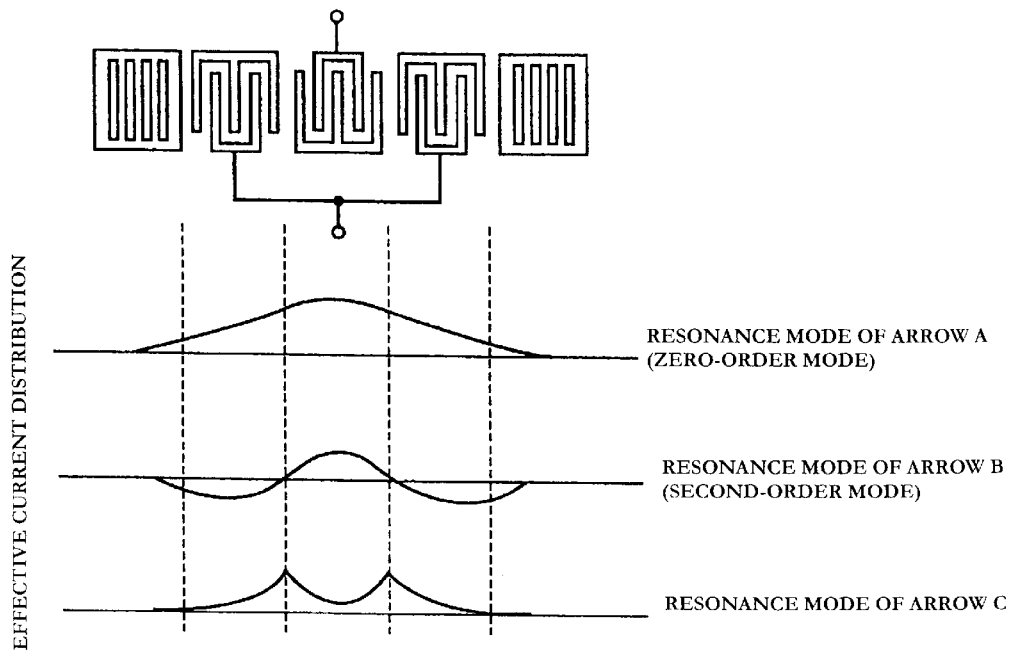
FIG. 4B shows the effective current distribution of each resonance mode of FIG. 4A.

The intensity distributions of the effective current of each resonance mode are shown in FIG. 4B. The response having the lowest frequency indicated by the arrow B is called a "second-order mode" and is a resonance mode having two nodes in the effective current intensity distribution.

The response in the center indicated by the arrow A is called a "zero-order mode" and is a resonance mode which does not have a node in the effective current intensity distribution.

The response having the highest frequency, indicated by the arrow C, is of a standing-wave resonance mode having peaks of the intensity distribution of the surface wave in the IDT-to-IDT spacing portions.

Of the above-described three resonance modes, in the resonance mode A which is in the center of the band and the resonance mode C which is in higher frequencies of the band, since the intensity of the effective current of the surface-acoustic wave in the IDT-to-IDT spacing portions is large, the IDT-to-IDT spacing is increased. As a result, this filter is very susceptible to an influence in which the area where the surface-acoustic wave is not excited or received is large.

As a result, since it is difficult to efficiently perform excitation and reception of a standing wave, high-impedance characteristics are achieved.

Figure 5:
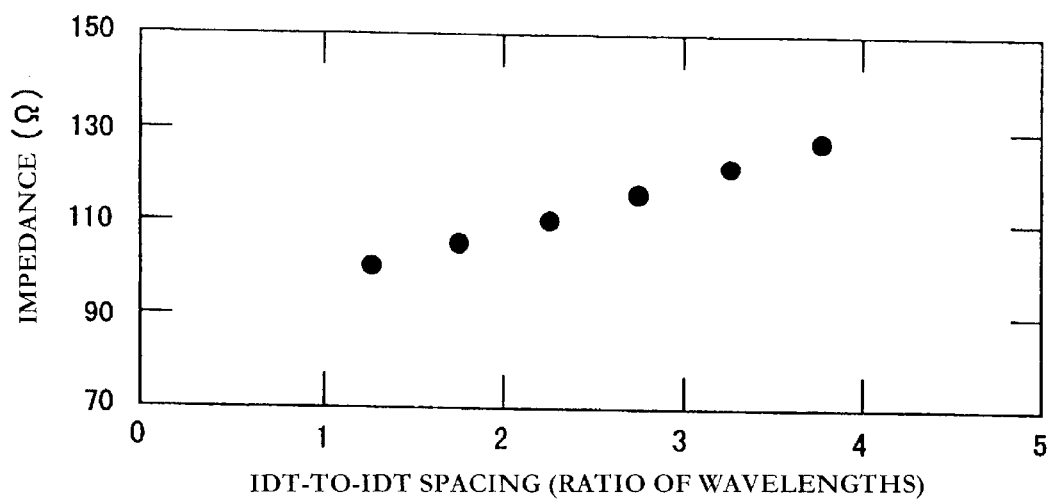
FIG. 5 shows the relationships between an IDT-to-IDT spacing and the input/output impedance of a surface acoustic wave filter element.

FIG. 5 shows the relationships between the IDT-to-IDT spacing of one surface acoustic wave filter element and the impedance characteristics where the IDT-to-IDT spacing is approximately 1.27 times the wavelength of the surface-acoustic wave is the base value and the IDT-to-IDT spacing is increased in units of half the wavelength. It can be seen from FIG. 5 that, by increasing the IDT-to-IDT spacing, the impedance characteristics of the surface acoustic wave filter element increases.

The differing of the impedance characteristics substantially influences the reflection characteristics at the connection point, and, in particular, causes the degree of amplitude balance to deteriorate. It is difficult for signals to be transmitted to an element having greater impedance, and the corresponding signals are transmitted to an element having lower impedance. Therefore, the differing of the impedance characteristics causes the degree of amplitude balance to deteriorate.

Therefore, when the surface acoustic wave element 102 is configured by a method of increasing the IDT-to-IDT spacing by half the wavelength of the surface-acoustic wave in order for the transmission phase characteristics to be inverted by 180° from those of the surface acoustic wave filter element 101, the impedance characteristics of the second surface acoustic wave filter element 102 vary toward a higher impedance in comparison with the impedance characteristics of the first surface acoustic wave filter element 101, causing the degree of amplitude balance to deteriorate.

Accordingly, in preferred embodiments of the present invention, the surface acoustic wave filter device is constructed such that, by considering that the impedance characteristics of the surface acoustic wave filter elements 101 and 102 depend on the total of the electrostatic capacitance values of the IDTs, the impedance characteristics of the surface acoustic wave filter element 102 are shifted toward a lower impedance by increasing the total of the electrostatic capacitance values of the plurality of IDTs 114 to 116 of the surface acoustic wave filter element 102, such that the unmatched impedance characteristics between the surface acoustic wave filter elements 101 and 102 is eliminated.

Regarding the ratio C2/C1 of the total C2 of the electrostatic capacitance values of the IDTs of the surface acoustic wave filter element 102 and the total C1 of the electrostatic capacitance values of the IDTs of the surface acoustic wave filter element 101, the relationships between the ratio C2/C1 of the capacitance values where the total C1 of the electrostatic capacitance values of the IDTs of the surface acoustic wave filter element 101 is used as a reference and the total C2 of the electrostatic capacitance values of the IDTs of the surface acoustic wave filter element 102 is varied are determined.

Figure 6:
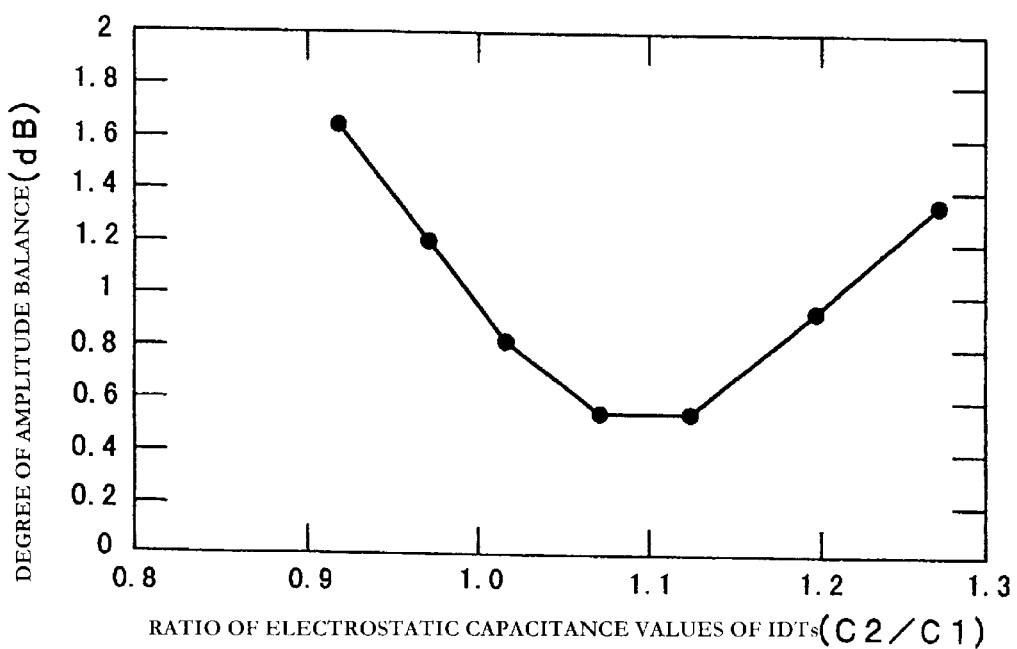
FIG. 6 shows the relationships between a ratio C2/C1 of the total of the electrostatic capacitance values of IDTs and the degree of amplitude balance.
Figure 7:
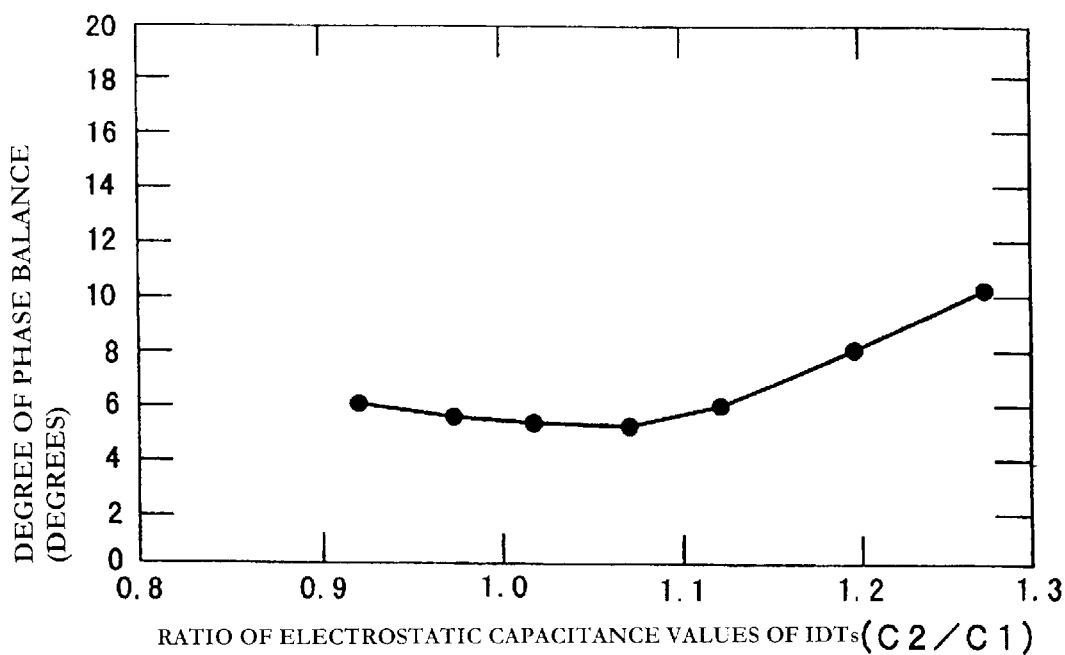
FIG. 7 shows the relationships between a ratio C2/C1 of the total of the electrostatic capacitance values of IDTs and the degree of phase balance.

FIGS. 6 and 7 show the relationships between the ratio C2/C1 of the total of the electrostatic capacitance values of the IDTs and the degree of balance where the total C1 of the electrostatic capacitance values of the IDTs 111 to 113 of the surface acoustic wave filter element 101 is fixed and the total C2 of the electrostatic capacitance values of the IDTs of the second surface acoustic wave filter element 102 is varied. It can be seen from FIG. 6 that, when the ratio C2/C1 is about 1.10, the degree of amplitude balance reaches a minimum, and the degree of amplitude balance is about 1.0 dB or less is satisfied when the ratio is in the range of about 1.0 to about 1.20.

Therefore, it can be seen that the degree of amplitude balance reaches a minimum value when the ratio C2/C1= 1.10 and that the degree of amplitude balance approaches 1.0 dB or less in the range of 1.00<C2/C1<1.20.

The electrostatic capacitance value of the IDT is proportional to the amount of electrode coverage, the electrode finger crossing width, and the number of pairs of the electrode fingers in the IDT.

Therefore, with respect to the amount of electrode coverage M1 of the IDTs of the surface acoustic wave filter element 101, the electrode finger crossing width W1, and the total number N1 of the IDTs, when the amount of electrode coverage M2 of the IDTs of the surface acoustic wave filter element 102, the electrode finger crossing width W2, the total number N2 of the pairs of the IDTs are preferably in the range of M1×W1×N1<M2×W2×N2<1.20×M1×W1×N1, the total of the electrostatic capacitance values of the IDTs is in the above-described preferable range, and the degree of amplitude balance and the degree of phase balance is greatly improved.

Figure 10:
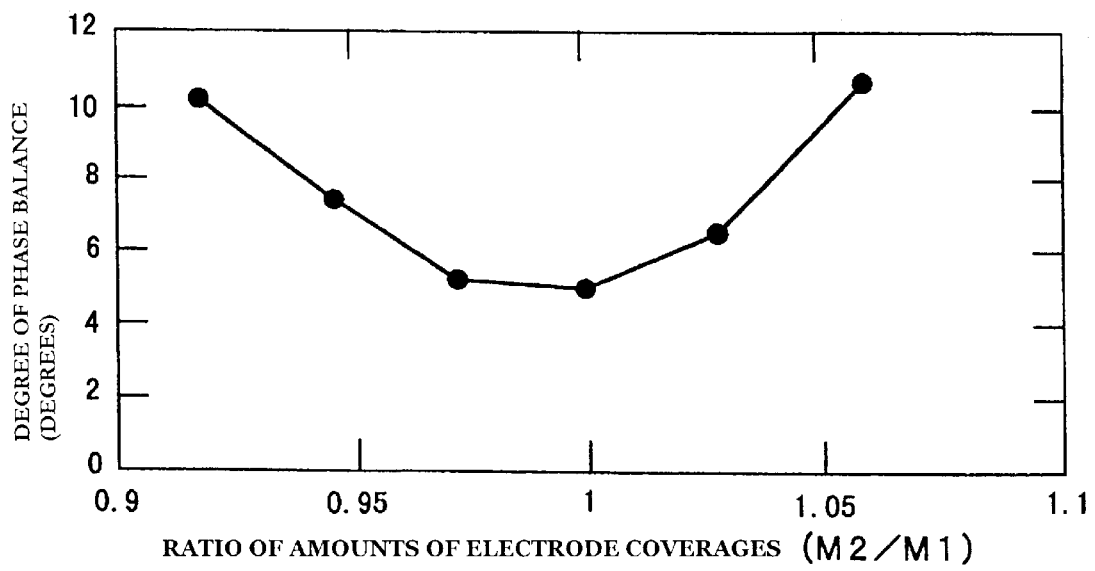
FIG. 10 shows the relationships between a ratio M2/M1 of the amounts of electrode coverages and the degree of phase balance.

Since the amount of electrode coverage of the IDT influences the propagation characteristics of the surface wave, for example, a sound speed, the influence on the degree of phase balance is large. The amount of electrode coverage of the surface acoustic wave filter element 101 was made different from that of the surface acoustic wave filter element 102, and changes in the degree of phase balance were examined. FIG. 10 shows the changes in the degree of phase balance with respect to the ratio M2/M1 of the amount of electrode coverage M2 of the surface acoustic wave filter element 102 to the amount of electrode coverage M1 of the surface acoustic wave filter element 101. Here, the electrode finger crossing width is set such that the ratio C2/C1 of the totals of the electrostatic capacitance values of the IDTs is in the above-described appropriate range.

As shown in FIG. 10, the degree of phase balance reaches a minimum when the ratio M2/M1 is in the range of approximately 0.97 to approximately 1.0. It can also be seen that the range which satisfies the condition of the degree of phase balance being about 10 degrees or less is in the approximate range of 0.93<M2/M1<1.05.

On the other hand, in the resonance mode B in the lower frequencies of the pass band shown in FIG. 4A, since the IDT-to-IDT spacing portion corresponds to a node of the effective current intensity distribution, the filter is not influenced when the IDT-to-IDT spacing is increased. However, the influence when the electrostatic capacitance value of the IDT is varied is similar to that of the other two resonance modes A and C.

Furthermore, when the IDT-to-reflector spacing is varied, the resonance mode in the lower frequencies of the pass band is affected the most. Therefore, the degree of balance is more effectively improved by optimizing the ratio C2/C1 of the total of the electrostatic capacitance values and at the same time, by optimizing the IDT-to-reflector spacing GR1 of the surface acoustic wave filter element 101 and the IDT-to-reflector spacing GR2 of the surface acoustic wave filter element 102.

Figure 8:
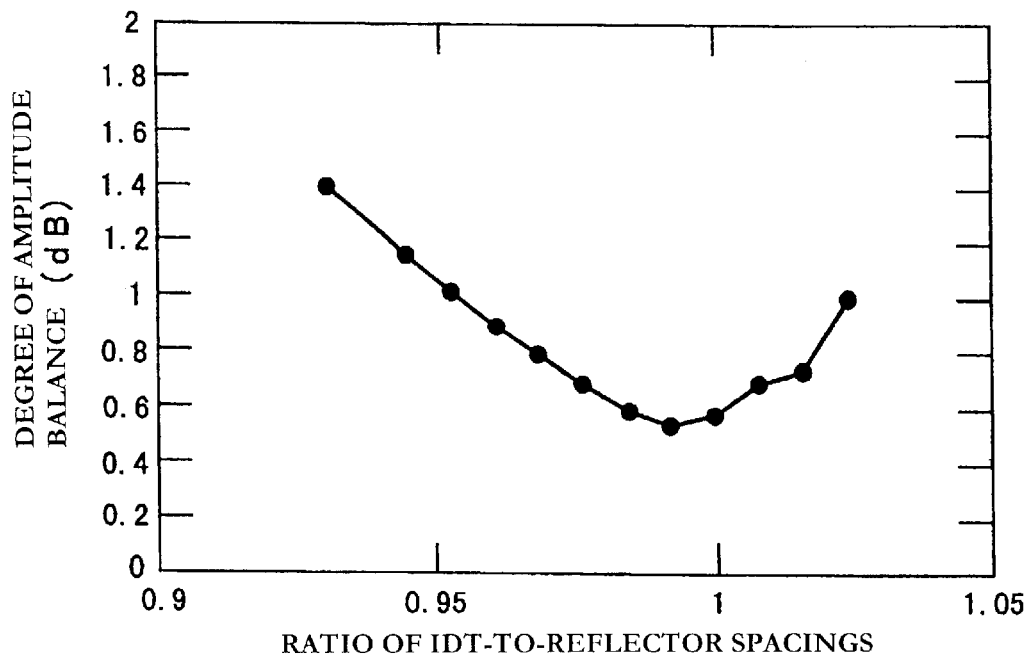
FIG. 8 shows the relationships between a ratio GR2/GR1 of the IDT-to-reflector spacings and the degree of amplitude balance.
Figure 9:
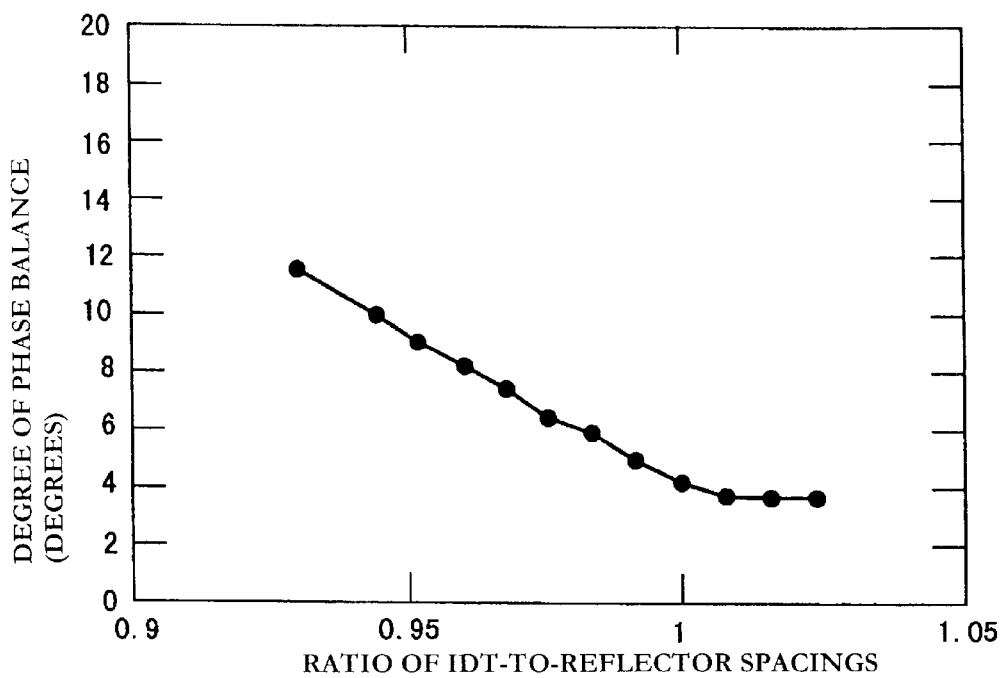
FIG. 9 shows the relationships between a ratio GR2/GR1 of the IDT-to-reflector spacings and the degree of phase balance.

FIGS. 8 and 9 show the relationships between the ratio GR2/GR1 where the IDT-to-reflector spacing GR2 is varied with respect to the IDT-to-reflector spacing GR1 and the degree of amplitude balance and between the ratio GR2/GR1 and the degree of phase balance, respectively.

It can be seen from FIG. 8 that the degree of amplitude balance reaches a minimum when the ratio GR2/GR1 is about 0.99 and that the range which satisfies the condition of the degree of amplitude balance being about 1.0 dB or less is 0.96<GR2/GR1<1.02. Furthermore, it can be seen from FIG. 9 that, if the ratio GR2/GR1 is in this range, the degree of phase balance is about 10 degrees or less.

Here, although a grating-type reflector is preferably used as a reflector, the reflector is not limited to a grating-type reflector, and a reflector using reflection on a tip end surface may be used.

As described above, by setting the ratio C2/C1 of the total C2 of the electrostatic capacitance values of the IDTs of the surface acoustic wave filter element 102 to the total C1 of the electrostatic capacitance values of the IDTs of the surface acoustic wave filter element 101 and by setting the ratio of the IDT-to-reflector spacing GR2 to the IDT-to-reflector spacing GR1 in the above-described specific ranges, the degree of balance is effectively improved in the surface acoustic wave filter device 100 having an unbalanced-to-balanced conversion function.

Although in this preferred embodiment, cascading-resonator-type surface acoustic wave filter elements 101 and 102 of a three-IDT type are preferably used, in the present invention, the number of the IDTs of the first and second surface acoustic wave filter elements is not limited to this, and cascading-resonator-type surface acoustic wave filters of a multiple-electrode type may be used.

Figure 11:
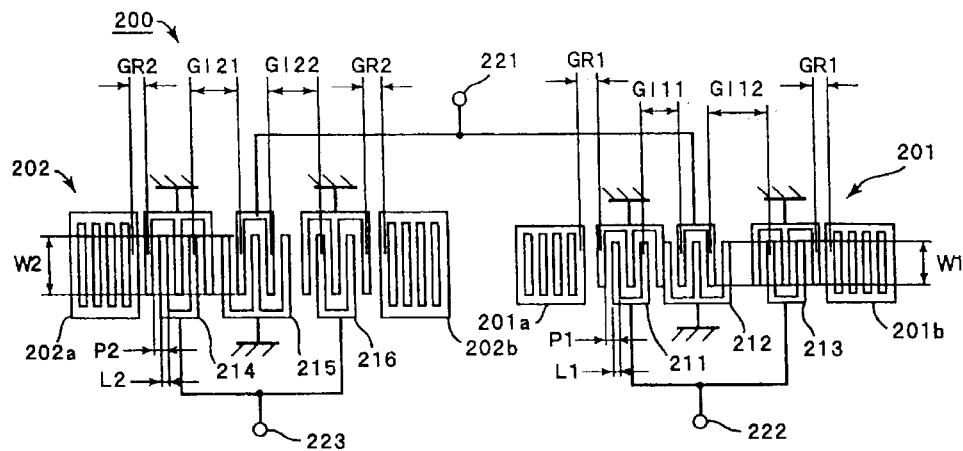
FIG. 11 is a schematic plan view illustrating a surface acoustic wave filter device according to a second preferred embodiment of the present invention.

FIG. 11 is a schematic plan view showing the electrode configuration of a surface acoustic wave filter device according to a second preferred embodiment of the present invention.

In this preferred embodiment, an electrode configuration is provided on a piezoelectric substrate made of a $LiTaO_3$ substrate as in the first preferred embodiment. Similarly to the first preferred embodiment, the piezoelectric substrate may be made of another piezoelectric single-crystal or piezoelectric ceramic.

In this preferred embodiment, each first terminal of each of a first surface acoustic wave filter element 201 and a second surface acoustic wave filter element 202 is connected to an unbalanced input terminal 221. Furthermore, each second terminal which is an output end of each of the first surface acoustic wave filter element 201 and the second surface acoustic wave filter element 202 is connected to balanced output terminal 222 and 223, respectively. Furthermore, the surface acoustic wave filter elements 201 and 202 are constructed in the same manner as the surface acoustic wave filter elements 101 and 102 of the first preferred embodiment. That is, the surface acoustic wave filter element 201 has IDTs 211 to 213 arranged along the surface wave propagation direction, and the surface acoustic wave filter element 202 has IDTs 214 to 216 arranged along the surface wave propagation direction. Furthermore, reflectors 201a, 201b, 202a, and 202b are provided on both sides of the IDTs in the surface wave propagation direction.

An unbalanced input terminal 221 is connected to the IDTs 212 and 215 in the approximate center. A balanced output terminal 222 is connected to the IDTs 211 and 213, and a balanced output terminal 223 is connected to the IDTs 214 and 216.

In the second preferred embodiment, in at least one of the first and second surface acoustic wave filter elements 201 and 202, at least one IDT-to-IDT spacing is different from the other IDT-to-IDT spacings by an integer multiple of the wavelength of the surface-acoustic wave, and thereby the degree of balance is improved. This will be described based on specific experimental examples.

The constructions of an example of the first and second surface acoustic wave filter elements 201 and 202 are as follows:

(1) The First Surface Acoustic Wave Filter Element 201

The electrode finger crossing width W1=125 μm.

The number of the pairs of the electrode fingers of the IDTs: the number of the pairs of the electrode fingers of the IDT 212 in the approximate center=17, and the number of pairs of electrode fingers of the IDTs 211 and 213 on both sides=11.

The electrode finger pitch P1 of the IDT=2.1 μm.

The amount of electrode coverage L1/P1=0.70 (L1 is the electrode finger width).

The number NR of the electrode fingers of the reflector =120.

The electrode finger pitch PR of the reflector=2.15 λm.

The IDT-to-IDT spacings: GI11 in FIG. 11=1.27λ, and GI12=2.27λ.

The IDT-to-reflector spacing GR1=0.500λ.

(2) The Second Surface Acoustic Wave Filter Element 202

The electrode finger crossing width W2=128 μm.

The number of pairs of electrode fingers of the IDTs: the number of the pairs of the electrode fingers of the IDT 115 in the approximate center=17, and the number of the pairs of the electrode fingers of the IDTs 214 and 216 on both sides=11.

The electrode finger pitch P2 of the IDT=2.1 μm.

The amount of electrode coverage L2/P2=0.70 (L2 is the electrode finger width).

The number NR of the electrode fingers of the reflector =120.

The electrode finger pitch λR of the reflector=2.15 µm.

The IDT-IDT spacing: GI21 in FIG. 11=1.77λ, and GI22 =1.77λ.

The IDT-to-reflector spacing GR2=0.498λ.where λ represents the wavelength of the surface-acoustic wave to be excited.

Figure 12:
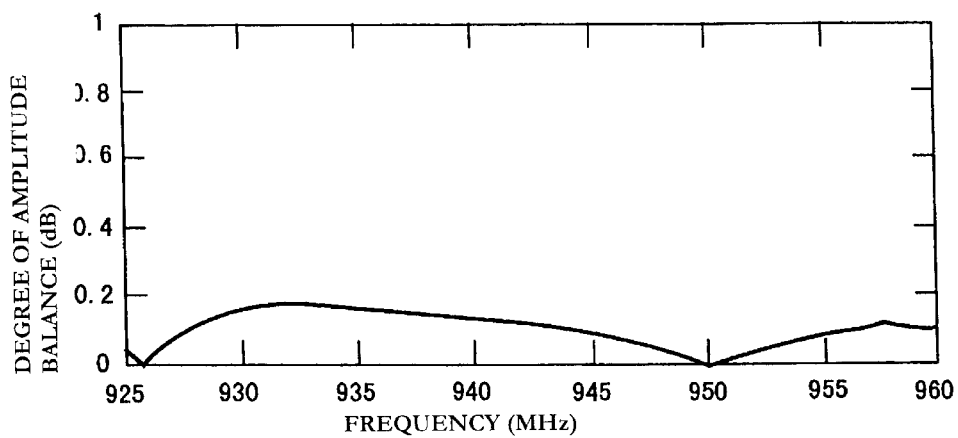
FIG. 12 shows the in-band degree of amplitude balance in the surface acoustic wave filter device of the second preferred embodiment of the present invention.
Figure 13:
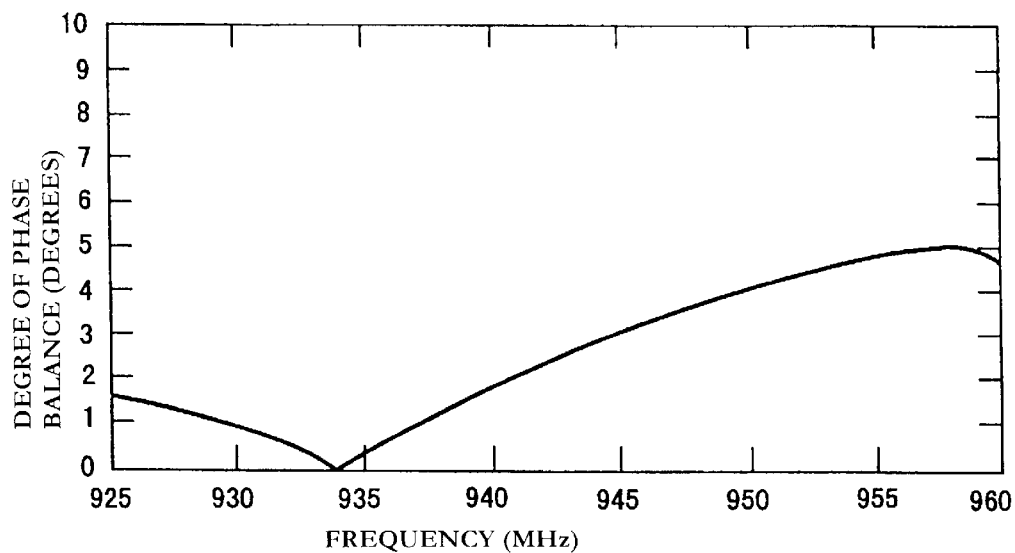
FIG. 13 shows the in-band degree of phase balance of the surface acoustic wave filter device of the second preferred embodiment of the present invention.

The frequency characteristics of the degree of amplitude balance of a surface acoustic wave filter device 200 of this preferred embodiment are shown in FIG. 12, and the frequency characteristics of the degree of phase balance of the surface acoustic wave filter device 200 of this preferred embodiment are shown in FIG. 13. A comparison between FIGS. 12 and 13 and FIGS. 20 and 21 which show the characteristics of the above-described conventional example shows that the in-band degree of phase balance is about 4.4 degrees or less in the conventional method, and about 5.0 degrees or less in this preferred embodiment, which is substantially the same. However, when the degrees of amplitude balance are compared, the degree of amplitude balance is increased up to 0.96 dB in the conventional method and only about 0.19 dB or less in this preferred embodiment.

The reason for this will be described below in more detail.

Also, in the surface acoustic wave filter device 200, an electrical signal input to the unbalanced input terminal 221 is filtered in the surface acoustic wave filter elements 201 and 202, and the output is supplied to the balanced output terminal 222 and 223. The electrical signal input to the surface acoustic wave filter element 202 is converted into a surface-acoustic wave by the IDT 215, and a standing wave is excited. The excited standing wave is converted again into an electrical signal by the IDTs 214 and 216. The signal to be transmitted is selected according to the frequency characteristics of the resonance mode of the standing wave to be excited, and the filtering described above is performed thereon.

Similarly, the electrical signal input to the surface acoustic wave filter element 201 is converted into a surface-acoustic wave by the IDT 212, and a standing wave is excited. The excited standing wave is converted into an electrical signal again by the IDTs 211 and 213. At this time, the signal to be transmitted is selected according to the frequency characteristics of the resonance mode of the standing wave to be excited, and a filtering is performed thereon.

In the surface acoustic wave filter element 201, the IDT-to-IDT spacing GI11 differs from the IDT-to-IDT spacing GI12, and this difference is one wavelength of the surface-acoustic wave. Therefore, the transmission phase characteristics of the signals induced in the IDTs 211 and 213 are approximately equal to each other.

As described above, the first and second surface acoustic wave filter elements 201 and 202 have the properties such that an increase in the IDT-to-IDT spacing causes the impedance characteristics to increase. Even when only some IDT-to-IDT spacings of the plurality of IDT-to-IDT spacings are increased, the impedance is increased. However, the variations in the impedance characteristics are much less than when all the IDT-to-IDT spacings are increased.

In the surface acoustic wave filter device 200 of this preferred embodiment, only two different IDT-to-IDT spacings are provided in the surface acoustic wave filter element 201. Therefore, the impedance characteristic has a value between the impedance characteristic when both the IDT-to-IDT spacings have a small value, that is, about 1.27λ, and the impedance characteristic when both IDT-to-IDT spacings have a large value, that is, about 2.27λ. As can be expected from FIG. 5, this intermediate value corresponds to the impedance characteristic when both the IDT-to-IDT spacings are about 1.77λ, and matches the impedance characteristic of the surface acoustic wave filter element 202.

Furthermore, the IDT-to-IDT spacings GI11 and GI12 in the surface acoustic wave filter element 201 differ by half the wavelength of the surface-acoustic wave from the IDT-to-IDT spacings GI21 and GI22 in the surface acoustic wave filter element 202. Therefore, the phase of the transmission phase characteristics of the signal induced in the balanced output terminal 222 differs by 180 degrees from the transmission phase characteristics of the signal induced in the balanced output terminal 223.

Therefore, the surface acoustic wave filter elements 201 and 202 have the properties such that the transmission phase characteristics differ by 180 degrees because the IDT-to-IDT spacings differ by half the wavelength. Furthermore, since the surface acoustic wave filter elements 201 and 202 have the same impedance characteristics, the difference in the amplitude characteristics between the signal induced in the balanced output terminal 222 and the signal induced in the balanced output terminal 223 decreases.

Figure 14:
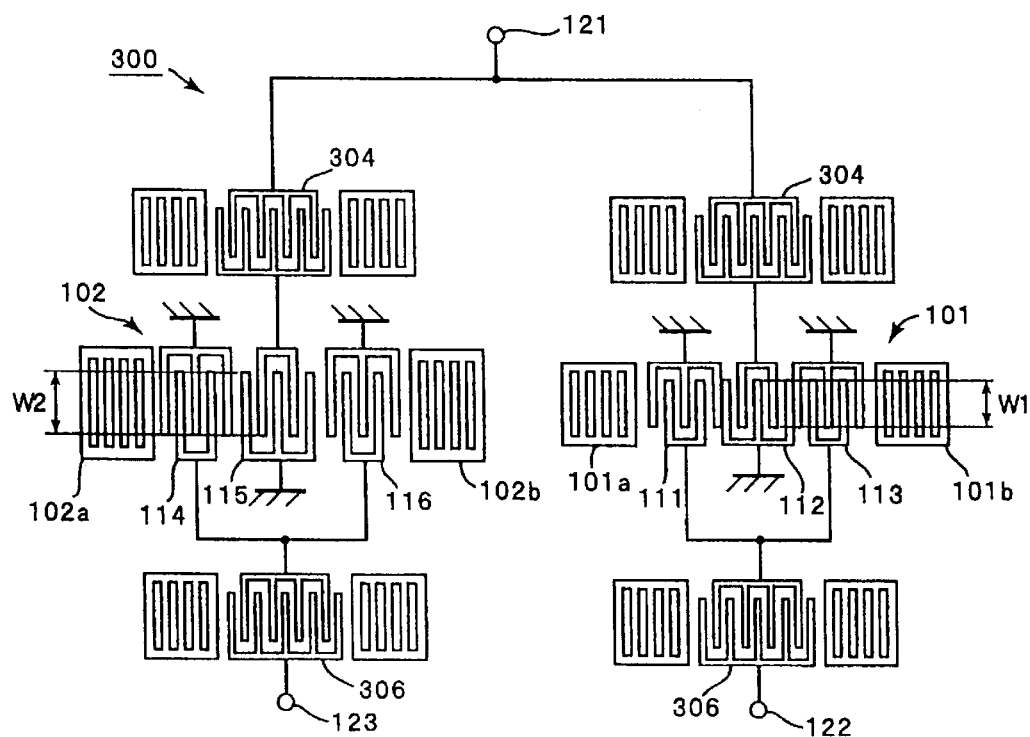
FIG. 14 is a schematic plan view showing the electrode configuration of a surface acoustic wave filter device according to a third preferred embodiment of the present invention.

A third preferred embodiment is a modification of the surface acoustic wave filter device 100 of the first preferred embodiment. As shown in FIG. 14, surface acoustic wave resonators 304 and 304 are connected to the unbalanced input terminal 121 side, and surface acoustic wave resonators 306 and 306 are connected to the balanced output terminals 122 and 123 side. The description of the remaining features is omitted, and reference is made to the description of the first preferred embodiment.

More specifically, the surface acoustic wave resonator 304 is connected between the unbalanced input terminal 111 and the first terminals of the first surface acoustic wave filter element 101, and another surface acoustic wave resonator 304 is connected between the unbalanced input terminal 111 and the first terminal of the second surface acoustic wave filter element 102. Furthermore, the surface acoustic wave resonator 306 is connected between the second terminal of the first surface acoustic wave filter element 101 and the balanced output terminals 112 and 113, and another surface acoustic wave resonator 306 is connected between the second terminal of the second surface acoustic wave filter element 102 and the balanced output terminals 112 and 113.

The constructions of an example of the surface acoustic wave resonators 304 and 306 are as follows:

(1) The Surface Acoustic Wave Resonator 304

The electrode finger crossing width W=88 µm.

The number N of pairs of the electrode fingers of the IDT=80.

The electrode finger pitch PI of the IDT =2.10 µm.

The number NR of the electrode fingers of the reflector=120.

The substrate . . . LiTaO₃.

(2) The Surface Acoustic Wave Resonator 306

The electrode finger crossing width W=80 µm.

The number N of the pairs of the electrode fingers of the IDT=80.

The electrode finger pitch PI of the IDT=2.12 µm.

The number NR of the electrode fingers of reflector=120.

The substrate . . . LiTaO₃.

Figure 15:
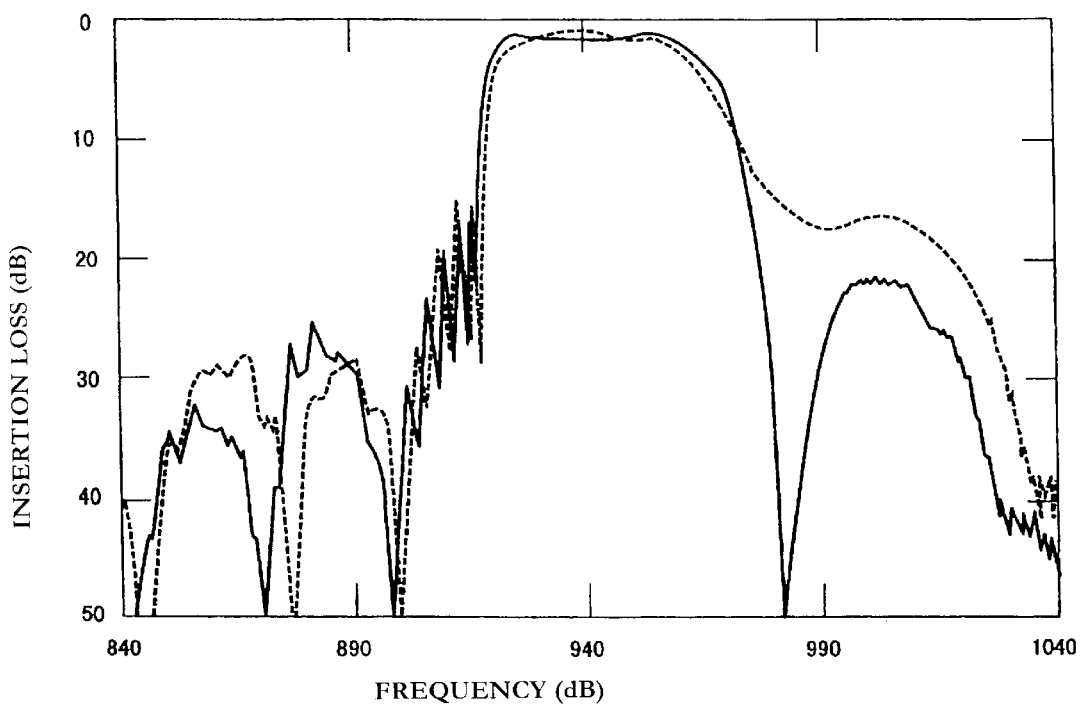
FIG. 15 shows the attenuation frequency characteristics of the surface acoustic wave filter device of the third preferred embodiment and the surface acoustic wave filter device of the first preferred embodiment of the present invention.

The attenuation frequency characteristics of a surface acoustic wave filter device 300 of the third preferred embodiment are shown in FIG. 15 using a solid line. For comparison purposes, the attenuation frequency characteristics of the first preferred embodiment are also shown in FIG. 15 using a broken line. It can be seen from FIG. 15 that, as a result of connecting the surface acoustic wave resonators 304 and 306 in series on the unbalanced input terminal 121 side and on the first balanced output terminals 122 and 123 side, respectively, the out-of-band attenuation, in particular, the attenuation in the higher frequencies of the pass band, is increased.

Figure 16:
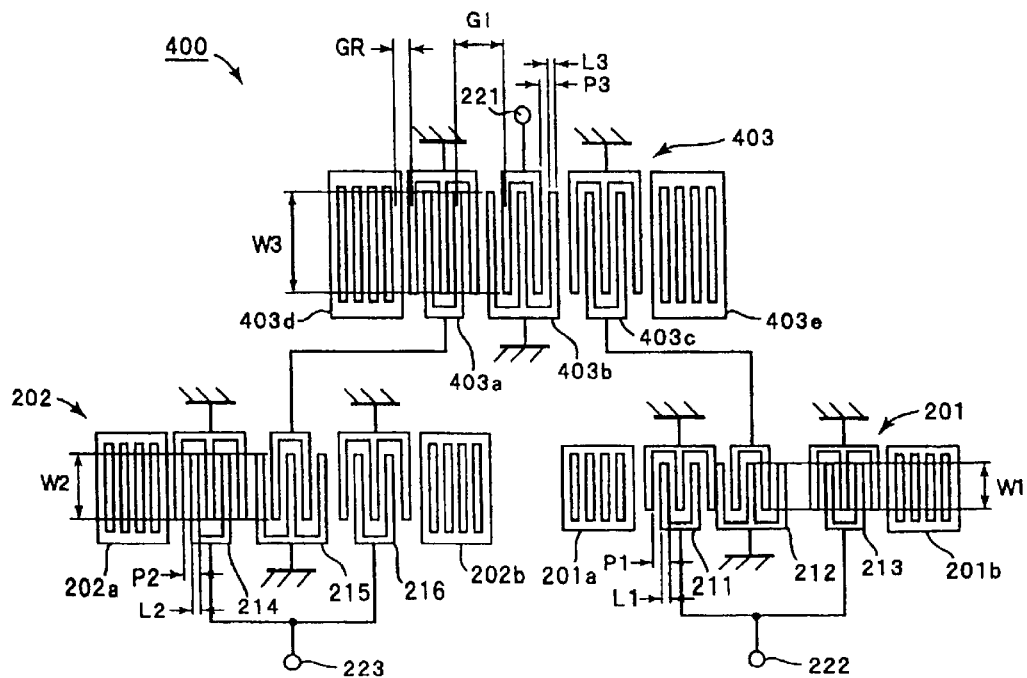
FIG. 16 is a schematic plan view illustrating a surface acoustic wave filter device according to a fourth preferred embodiment of the present invention.

FIG. 16 is a schematic plan view showing the electrode configuration of a surface acoustic wave filter device according to a fourth preferred embodiment of the present invention.

In the surface acoustic wave filter device of the fourth preferred embodiment, on the unbalanced input terminal side of the surface acoustic wave filter device 200 of the second preferred embodiment, three IDTs 403a to 403c, and a surface acoustic wave resonator-type filter 403 having reflectors 403d and 403e are connected. The remaining construction is the same as in the second preferred embodiment.

In the fourth preferred embodiment, since the surface acoustic wave resonator-type filter 403 is connected to the unbalanced input terminal 221 side, the attenuation in the higher frequencies of the pass band is increased. This will be described with reference to specific experimental examples.

The construction is substantially the same as the second preferred embodiment. However, the surface acoustic wave resonator-type filter 403 was designed as follows:

The electrode finger crossing width W3=240 μm.

The number of the pairs of the IDTs: the number of the pairs of the electrode fingers of the IDT 403b in the approximate center is 17, and the number of the pairs of the electrode fingers of each of the IDTs 403a and 403c on both sides is 11.

The electrode finger pitch P3 of the IDTs 403a to 403c= 2.1 μm.

The amount of electrode coverage L3/P3=0.72 (L3 is the electrode finger width)

The number NR of the electrode fingers of the reflectors 403d and 403e=120.

The electrode finger pitch PR of the reflectors 403d and 403e=2.15μm.

The IDT-to-IDT spacing GI=1.27λ.

The IDT-to-reflector spacing GR=0.500λ.

The substrate . . . LiTaO$_3$.

Figure 17:
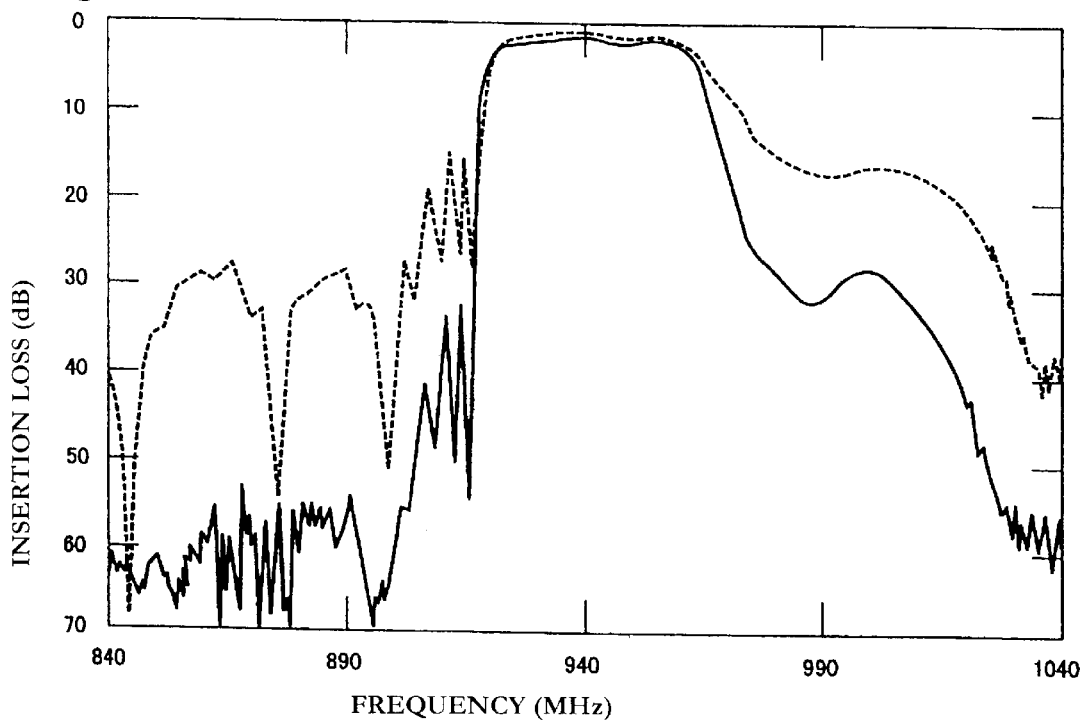
FIG. 17 shows the attenuation frequency characteristics of the surface acoustic wave filter device of the fourth preferred embodiment and the surface acoustic wave filter device of the second preferred embodiment of the present invention.

The attenuation frequency characteristics of the surface acoustic wave filter device of the fourth preferred embodiment, to which the surface acoustic wave resonator-type filter 403 having the above-described configuration is connected, are shown in FIG. 17 using a solid line. For comparison purposes, the attenuation frequency characteristics of the surface acoustic wave filter device of the second preferred embodiment are shown in FIG. 17 using a broken line. It can be seen from FIG. 17 that, according to the fourth preferred embodiment, the attenuation in the higher frequencies of the pass band is increased.

Figure 18:
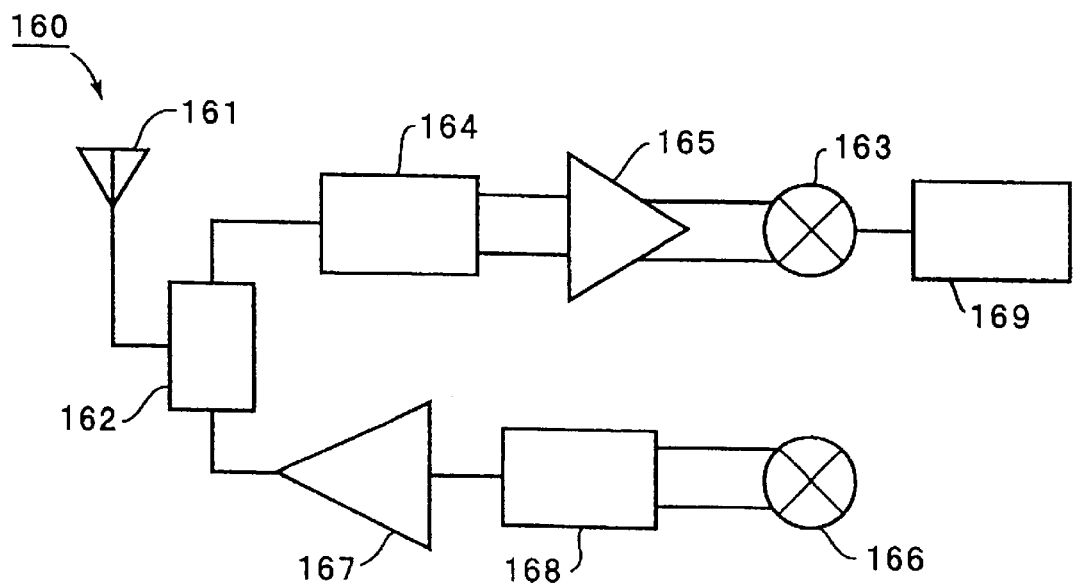
FIG. 18 is a schematic block diagram illustrating a communication device in which a surface acoustic wave filter device according to various preferred embodiments of the present invention is used.

FIG. 18 is a schematic block diagram illustrating a communication device 160 including a surface acoustic wave filter device according to various preferred embodiments of the present invention.

In FIG. 18, a duplexer 162 is connected to an antenna 161. A surface acoustic wave filter 164 and an amplifier 165 which define an RF stage are connected between the duplexer 162 and a mixer 163 on the receiving side. Furthermore, a surface acoustic wave filter 169 of the IF stage is connected to the mixer 163. Furthermore, an amplifier 167 and a surface acoustic wave filter 168 which define the RF stage are connected between the duplexer 162 and a mixer 166 on the transmission side.

Surface Acoustic wave filter devices which are constructed in accordance with various preferred embodiments of the present invention are suitably used as the surface acoustic wave filters 164 and 168 in the communication device 160.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A surface acoustic wave filter device comprising:

a piezoelectric substrate;

a first surface acoustic wave filter element having a plurality of IDTs arranged along a propagation direction of a surface acoustic wave on the piezoelectric substrate and having first and second terminals; and a second surface acoustic wave filter element having a plurality of IDTs including input/output IDTS arranged along the propagation direction of a surface acoustic wave on the piezoelectric substrate, the spacing between the input/output IDTs being greater than that of the first surface acoustic wave filter element by approximately half the wavelength of the surface acoustic wave, and having first and second terminals;

the first terminals of the first and second surface acoustic wave filter elements being commonly connected to an unbalanced terminal, and the second terminals of the first and second surface acoustic wave filter elements being connected to a balanced terminal;

wherein the total of the electrostatic capacitance values of the plurality of IDTs of the second surface acoustic wave filter element is greater than the total of the electrostatic capacitance values of the plurality of IDTs of the first surface acoustic wave filter element.

2. A surface acoustic wave filter device according to claim 1, wherein when the total of the electrostatic capacitance values of the plurality of IDTs of the second surface acoustic wave filter element is denoted as C2 and when the total of the electrostatic capacitance values of the plurality of IDTs of the first surface acoustic wave filter element is denoted as C1, the condition C1<C2<1.20(C1) is satisfied.

3. A surface acoustic wave filter device according to claim 1, wherein when the amount of electrode coverage in the plurality of IDTs of the first surface acoustic wave filter element is denoted as M1, the electrode finger crossing width is denoted as W1, the total number of pairs of the electrode fingers of the plurality of IDTs is denoted as N1, the amount of electrode coverage in the plurality of IDTs of the second surface acoustic wave filter element is denoted as M2, the electrode finger crossing width is denoted as W2, the total number of pairs of the electrode fingers of the plurality of IDTs is denoted as N2, the condition M1×W1×N1<M2×W2×N2<1.20×M1×W1×N1 is satisfied.

4. A surface acoustic wave filter device according to claim 3, wherein the condition 0.93×M1<M2<1.05×M1 is satisfied.

5. A surface acoustic wave filter device according to claim 1, wherein the first and second surface acoustic wave filter elements have reflectors on both sides of the plurality of IDTs, when the spacing between the reflector of the first surface acoustic wave filter element and the IDT adjacent to the reflector is denoted as GR1, and when the spacing between the reflector of the second surface acoustic wave filter element and the IDT adjacent to the reflector is denoted as GR2, the condition 0.96GR1<GR2<1.02GR1 is satisfied.

6. A surface acoustic wave filter device according to claim 1, further comprising surface acoustic wave resonators which are connected in parallel or in series on at least one of said balanced terminal side and said unbalanced terminal side.

7. A surface acoustic wave filter device according to claim 1, further comprising surface acoustic wave resonator-type filters which are cascaded on at least one of said balanced terminal side and said unbalanced terminal side.

8. A communication device comprising a surface acoustic wave filter device according to claim 1.

9. A surface acoustic wave filter device comprising:
a piezoelectric substrate;
a first surface acoustic wave filter element having a plurality of IDTs arranged along a propagation direction of a surface acoustic wave on the piezoelectric substrate and having first and second terminals; and
a second surface acoustic wave filter element having a plurality of IDTs including input/output IDTs provided along the propagation direction of a surface acoustic wave on the piezoelectric substrate, the spacing between input/output IDTs being larger than that of the first surface acoustic wave filter element by approximately half the wavelength of the surface-acoustic wave, and having first and second terminals;
the first terminals of the first and second surface acoustic wave filter elements being commonly connected to an unbalanced terminal, and the second terminals of the first and second surface acoustic wave filter elements being connected to a balanced terminal;
wherein in at least one of the first and second surface acoustic wave filter elements, at least one IDT-to-IDT spacing is different from the other IDT-to-IDT spacings by an integer multiple of the wavelength of the surface-acoustic wave.

10. A surface acoustic wave filter device according to claim 9, wherein, in the first surface acoustic wave filter element, at least one IDT-to-IDT spacing is different from the other IDT-to-IDT spacings by an integer multiple of the wavelength of the surface acoustic wave, and
in the second surface acoustic wave filter element, a plurality of the IDT-to-IDT spacings are greater than the smallest IDT-to-IDT spacing of the first surface acoustic wave filter element and are less than the largest IDT-to-IDT spacing of the first surface acoustic wave filter element.

11. A surface acoustic wave filter device according to claim 9, wherein, in the first surface acoustic wave filter element, at least one IDT-to-IDT spacing is different from the other IDT-to-IDT spacings by approximately one wavelength of the surface acoustic wave, and in the second surface acoustic wave filter element, the plurality of IDT-to-IDT spacings have substantially the same value and are greater than the smallest IDT-to-IDT spacing of the first surface acoustic wave filter element by approximately half the wavelength of the surface acoustic wave.

12. A surface acoustic wave filter device according to claim 9, further comprising surface acoustic wave resonators which are connected in parallel or in series on at least one of said balanced terminal side and said unbalanced terminal side.

13. A surface acoustic wave filter device according to claim 9, further comprising surface acoustic wave resonator-type filters which are cascaded on at least one of said balanced terminal side and said unbalanced terminal side.

14. A surface acoustic wave filter device according to claim 9, wherein the total of the electrostatic capacitance values of the plurality of IDTs of the second surface acoustic wave filter element is greater than the total of the electrostatic capacitance values of the plurality of IDTs of the first surface acoustic wave filter element.

15. A surface acoustic wave filter device according to claim 9, wherein when the total of the electrostatic capacitance values of the plurality of IDTs of the second surface acoustic wave filter element is denoted as C2 and when the total of the electrostatic capacitance values of the plurality of IDTs of the first surface acoustic wave filter element is denoted as C1, the condition C1<C2<1.20C1 is satisfied.

16. A surface acoustic wave filter device according to claim 9, wherein when the amount of electrode coverage in the plurality of IDTs of the first surface acoustic wave filter element is denoted as M1, the electrode finger crossing width is denoted as W1, the total number of pairs of the electrode fingers of the plurality of IDTs is denoted as N1, the amount of amount of electrode coverage in the plurality of IDTs of the second surface acoustic wave filter element is denoted as M2, the electrode finger crossing width is denoted as W2, the total number of pairs of the electrode fingers of the plurality of IDTs is denoted as N2, the condition M1×W1×N1<M2×W2×N2<1.20×M1×W1×N1 is satisfied.

17. A surface acoustic wave filter device according to claim 16, wherein the condition 0.93×M1<M2<1.05×M1 is satisfied.

18. A surface acoustic wave filter device according to claim 9, wherein the first and second surface acoustic wave filter elements have reflectors on both sides of the plurality of IDTs, when the spacing between the reflector of the first surface acoustic wave filter element and the IDT adjacent to the reflector is denoted as GR1, and when the spacing between the reflector of the second surface acoustic wave filter element and the IDT adjacent to the reflector is denoted as GR2, the condition 0.96GR1<GR2<1.02GR1 is satisfied.

19. A communication device comprising a surface acoustic wave filter device according to claim 9.

* * * * *

UNITED STATES PATENT AND TRADEMARK OFFICE
CERTIFICATE OF CORRECTION

| | | |
|---|---|---|
| PATENT NO. | : 6,731,188 B2 | Page 1 of 1 |
| APPLICATION NO. | : 10/087800 | |
| DATED | : May 4, 2004 | |
| INVENTOR(S) | : Yoichi Sawada et al. | |

It is certified that error appears in the above-identified patent and that said Letters Patent is hereby corrected as shown below:

Col. 8, line 15 of the above-identified patent should read as follows:

IDTs 114 and 116 on both sides=11.

Signed and Sealed this

Fifteenth Day of February, 2011

David J. Kappos
*Director of the United States Patent and Trademark Office*